US012411185B2

(12) United States Patent
Pennisi et al.

(10) Patent No.: US 12,411,185 B2
(45) Date of Patent: Sep. 9, 2025

(54) METHOD OF OPERATING BATTERY MANAGEMENT SYSTEMS, CORRESPONDING DEVICE AND VEHICLE

(71) Applicant: STMicroelectronics S.r.l., Agrate Brianza (IT)

(72) Inventors: Orazio Pennisi, Pieve Emanuele (IT); Valerio Bendotti, Vilminore di Scalve (IT); Vittorio D'Angelo, Nocera Superiore (IT); Paolo Turbanti, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 686 days.

(21) Appl. No.: 17/711,543

(22) Filed: Apr. 1, 2022

(65) Prior Publication Data

US 2022/0219544 A1 Jul. 14, 2022

Related U.S. Application Data

(63) Continuation of application No. 16/893,771, filed on Jun. 5, 2020, now Pat. No. 11,312,238.

(30) Foreign Application Priority Data

Jun. 17, 2019 (IT) .................. 102019000009237

(51) Int. Cl.
*H02J 7/00* (2006.01)
*B60L 3/00* (2019.01)
(Continued)

(52) U.S. Cl.
CPC .......... *G01R 31/396* (2019.01); *B60L 3/0046* (2013.01); *B60L 50/60* (2019.02);
(Continued)

(58) Field of Classification Search
CPC .... H02J 7/0013; H02J 7/00308; H02J 7/0047; B60L 3/0046; B60L 50/60; B60L 58/20;
(Continued)

(56) References Cited

U.S. PATENT DOCUMENTS 5,818,201 A 10/1998 Stockstad et al.
8,103,401 B2 1/2012 Kubo et al.
(Continued)

FOREIGN PATENT DOCUMENTS

CN 203326062 U 12/2013
CN 105599632 A 5/2016
(Continued)

*Primary Examiner* — Zixuan Zhou
(74) *Attorney, Agent, or Firm* — Slater Matsil, LLP (57) ABSTRACT

A method can be used to control a battery management system. A first voltage drop is sensed between a first terminal of a first battery cell and a second terminal of the first battery cell and a second voltage drop is sensed between a first terminal of a second battery cell and a second terminal of the second battery cell. A faulty condition is detected in the first battery cell or the second battery cell based on the first voltage drop or the second voltage drop. The first voltage drop is swapped for a first swapped voltage drop between a common terminal and the second terminal of the second battery cell.

21 Claims, 6 Drawing Sheets

(51) Int. Cl.
*B60L 50/60* (2019.01)
*B60L 58/20* (2019.01)
*G01R 31/396* (2019.01)
*B60K 6/28* (2007.10)

(52) U.S. Cl.
CPC ............ *B60L 58/20* (2019.02); *H02J 7/0013* (2013.01); *H02J 7/00308* (2020.01); *H02J 7/0047* (2013.01); *B60K 6/28* (2013.01); *B60L 2240/547* (2013.01); *B60Y 2200/91* (2013.01); *B60Y 2200/92* (2013.01)

(58) Field of Classification Search
CPC .... B60L 2240/547; B60Y 2200/91–92; G01R 31/396; B60K 6/28
USPC .......................................... 320/116–119, 134
See application file for complete search history.

(56) References Cited

U.S. PATENT DOCUMENTS

| | | |
|---|---|---|
| 11,077,755 B2 | 8/2021 | Pennisi et al. |
| 2001/0052760 A1 | 12/2001 | Amano et al. |
| 2005/0242667 A1 | 11/2005 | Emori et al. |
| 2005/0242980 A1 | 11/2005 | Collins et al. |
| 2008/0272739 A1 | 11/2008 | Carrier et al. |
| 2010/0134068 A1 | 6/2010 | Lim |
| 2012/0206105 A1 | 8/2012 | Nishizawa et al. |
| 2013/0026994 A1 | 1/2013 | Morikawa |
| 2013/0093383 A1 | 4/2013 | Kim et al. |
| 2013/0214595 A1 | 8/2013 | Sierak et al. |
| 2014/0225622 A1 | 8/2014 | Kudo et al. |
| 2014/0253135 A1 | 9/2014 | Eguchi et al. |
| 2014/0306662 A1 | 10/2014 | Kim et al. |
| 2017/0126035 A1 | 5/2017 | Tosch et al. |
| 2017/0184678 A1* | 6/2017 | Sekiguchi ............ G01R 31/385 |
| 2017/0254854 A1 | 9/2017 | Honda |
| 2018/0149689 A1 | 5/2018 | Ollitrault et al. |
| 2019/0339335 A1 | 11/2019 | Kim et al. |
| 2019/0366849 A1 | 12/2019 | Pennisi et al. |
| 2019/0372178 A1 | 12/2019 | Pennisi et al. |

FOREIGN PATENT DOCUMENTS

| | | |
|---|---|---|
| CN | 206416854 U | 8/2017 |
| EP | 2787594 A2 | 10/2014 |
| WO | 2018128257 A1 | 7/2018 |

\* cited by examiner

FIG. 7

METHOD OF OPERATING BATTERY MANAGEMENT SYSTEMS, CORRESPONDING DEVICE AND VEHICLE

CROSS-REFERENCE TO RELATED APPLICATIONS

This application is a continuation of U.S. patent application Ser. No. 16/893,771, filed on Jun. 5, 2020, which claims priority to Italian Patent Application No. 102019000009237, filed on Jun. 17, 2019, and is related to U.S. patent application Ser. No. 16/420,875, filed on May 23, 2019 and claiming priority to IT 102018000005810 (filed May 29, 2018); U.S. patent application Ser. No. 16/420,992, filed on May 23, 2019 and claiming priority to IT 102018000005828 (filed May 29, 2018); and U.S. patent application Ser. No. 16/893,729 filed on Jun. 5, 2020 and claiming priority to IT 102019000009234 (filed Jun. 17, 2019), all of which applications are hereby incorporated herein by reference as if reproduced in their entireties.

TECHNICAL FIELD

The description relates to battery management systems as well as a corresponding device and vehicle.

BACKGROUND

The evolving technology of electric vehicles (EVs) and hybrid electric vehicles (HEVs) makes improved performance of battery management systems (BMS) a desirable feature in order to facilitate safe, reliable and cost-efficient battery operation.

A task of a battery management system (BMS) involves measuring the battery cells' voltage. This in turn involves extracting relatively small voltages from comparatively high common mode voltages.

Additionally, it is noted that, for instance in automotive applications, the electric motor of the vehicle and its associated driver circuitry may be the source of noise in the form of currents injected into the battery cells or as a voltage drops across these cells. These may represent a source of electromagnetic interference over a wide range of frequencies with possible undesired effects on functional measurements.

Lack of accuracy in these measurements may adversely affect battery pack longevity and performance.

Accuracy may be pursued by placing differential voltage amplifiers with a high common-mode rejection ratio (CMRR) at each cell to provide a voltage level shift (that is translated signals) available to be digitized by an analogue-to-digital converter (ADC). Such a stage can be equipped with a number of other features such as protection and diagnostics (open load detection, leakage detection, built-in self-test or BIST, for instance). Such features are highly desirable in the automotive sector in order to facilitate complying with safety specifications.

A desirable feature of arrangements as considered herein is that, as a result of a faulty condition being detected via a built-in self-test, for instance the possibility may exist of maintaining detection of undervoltage (UV) and/or overvoltage (OV) conditions occurring in the cells in a battery pack.

SUMMARY

The description relates to battery management systems. One or more embodiments can be applied in the automotive field, for instance to electric vehicles and/or hybrid electric vehicles One or more embodiments can contribute in providing improved solutions along the lines discussed in the foregoing.

One or more embodiments may relate to a corresponding device, for instance a battery management system or BMS.

One or more embodiments may relate to a vehicle (for instance, a motor vehicle such as an EV or a HEV) equipped with such a device.

The claims are an integral part of the technical description of one or more embodiments as provided herein.

One or more embodiments may provide a secondary or auxiliary path, independent of a main one, to detect UV/OV conditions of cells.

One or more embodiments may thus provide a certain redundancy to diagnose errors/faults while retaining the capability of operating adequately, even if at a reduced performance level.

One or more embodiments may facilitate achieving that result saving semiconductor area.

BRIEF DESCRIPTION OF THE DRAWINGS

One or more embodiments will now be described, by way of example only, with reference to the annexed figures, wherein.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

As discussed, a desirable feature of arrangements as considered herein is that, as a result of a faulty condition being detected, via a built-in self-test procedure, for instance, the possibility may exist of maintaining detection of undervoltage (UV) and/or overvoltage (OV) conditions occurring in the cells in a battery pack.

Various solutions have been devised as discussed previously which are capable of performing a fault diagnosis, with a built-in self-test (BIST) procedure run and an error flag activated if an error is found to occur.

Examples of such an error/fault/failure (these designations are used herein as synonyms) may be represented by a lack of integrity of level shifters embedded in an analog front end and/or by an analog-to-digital converter or ADC being out of compliance due to bandgap deviation or other errors.

Arrangements for performing such acts may comprise various arrangements known to those of skill in the art.

Arrangements for performing such acts may also comprise various arrangements discussed in Italian patent applications 102018000005810 (U.S. counter-part publication 2019/0366849), 102018000005828 (U.S. counter-part publication US20190372178), and 102019000009234 (filed on the same date the priority application of the present case). Each of these applications is incorporated herein by reference.

As a result of such a flag being activated one may conceive to enable a set of window comparators and/or to add a secondary processing chain (an analog-to-digital converter or ADC, for instance).

Such solutions may be hardly acceptable in order to comply with safety specifications (in the automotive area, for instance) insofar as vehicle stopping may ensue.

Also, adding a set of programmable UV/OV (undervoltage/overvoltage) comparators for the cells able to operate even in the presence of a fault on the main detection path involves an intrinsic redundancy likely to have a negative impact on circuit complexity and semiconductor area. For instance, in the presence of n cells, $2^n$ comparators would be involved in detecting UV/OV conditions.

Adding a secondary processing chain (an analog-to-digital converter or ADC, for instance) may look more promising as a solution insofar as that approach may facilitate obtaining the actual voltage of a cell, in addition to merely detecting an UV/OV condition. Also, a secondary measurement path via, for instance, a single 10-bit successive approximation register (SAR) ADC with an input multiplexer may facilitate performing additional tasks such as measuring external resistors, analog signals on GPIO pins, and various internal voltages.

This solution would be again likely to have a negative impact on circuit complexity and semiconductor area. Such a negative impact could be attempted to be palliated by using a single (possibly simplified) ADC multiplexed over the various cells, which in turn would have undesired effects in terms of reduced performance and measurements on individual cells being staggered over time.

Figure 1:
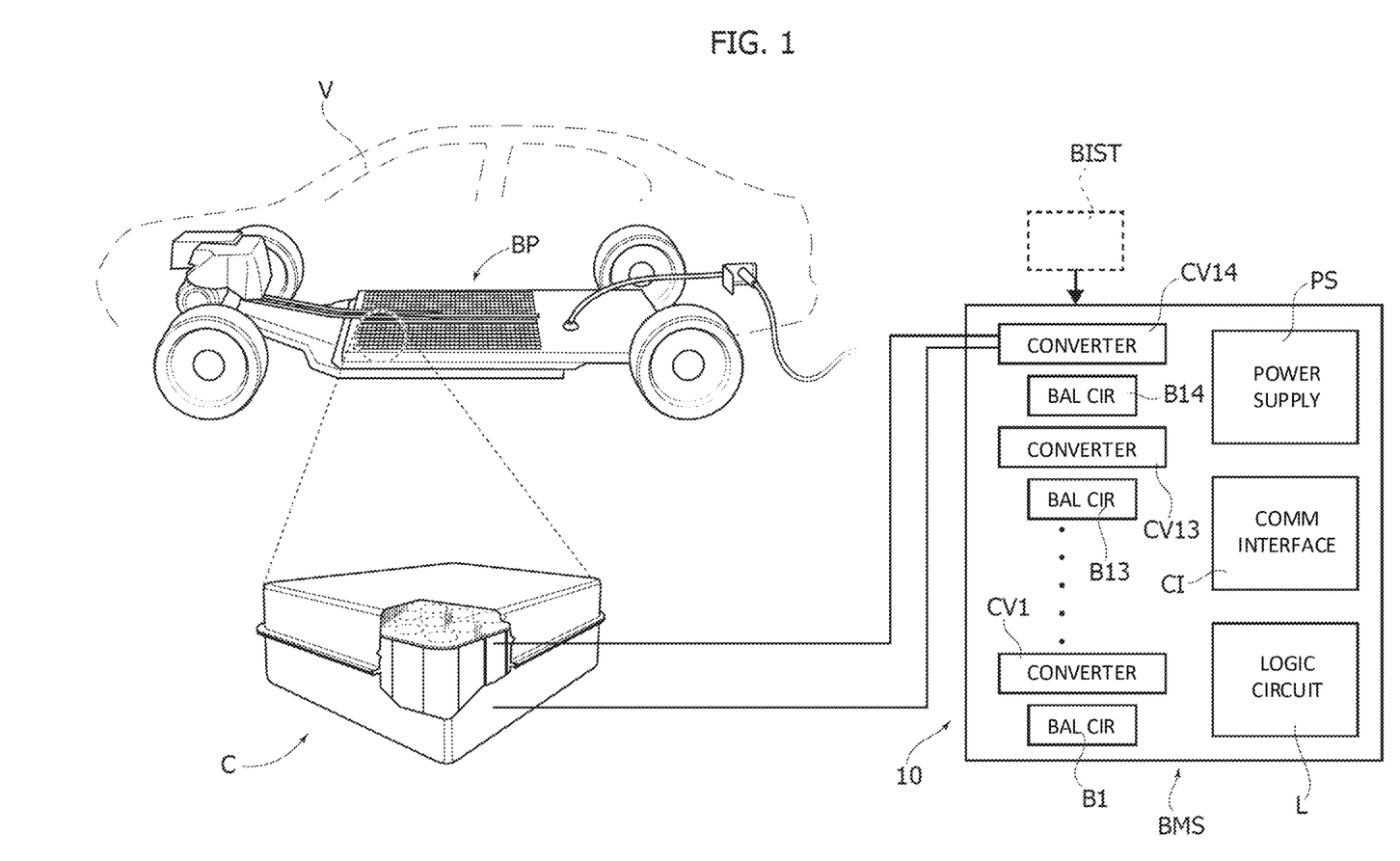
FIG. 1 is a block diagram exemplary of a possible context of use of embodiments.

FIG. 1 is exemplary of a possible arrangement of a battery pack BP equipping a vehicle V such as an electric vehicle (EV) or a hybrid electric vehicle (HEV) with an associated battery management system BMS. A lithium battery pack may be exemplary of such a battery pack.

Reference to such a possible area of application and/or to such battery technology is not however to be understood in a limiting sense of embodiments.

In one or more embodiments as exemplified herein, the battery management system BMS may comprise a device 10 (for instance an integrated circuit IC) providing various features desirable in performing battery management, for instance with a (single) device 10 configured to monitor from 4 up to 14 cells C.

In one or more embodiments, the device 10 can be configured to co-operate with a power supply PS (which may be derived from the very battery pack BP monitored by the device 10), a communication interface CI and logic circuitry L.

In one or more embodiments the logic block L exemplified in FIG. 1 may comprise such a microcontroller.

The device 10 may also generate stable internal references, for instance by means of a voltage regulator and bootstrap circuit. Also, it may comprise bandgaps as monitored by internal circuitry to facilitate measurement accuracy.

A task of the device 10 may comprise monitoring cell and battery pack status through stack voltage measurement and cell voltage measurement. The related measurement and diagnostic tasks can be executed either on demand or periodically, for instance with a programmable cycle interval.

Measurement data may be made available for an external controller to perform a charge balancing and to compute data indicative of the State of Health (SOH) and State of Charge (SOC) of the cells/battery pack.

In a normal operating mode, the device 10 may perform measurement conversions, diagnostics and communication tasks. Optionally, the device 10 can be set to a cyclic wake up state, thus reducing current consumption (for instance as absorbed from the battery pack BP). While in the cyclic wake up state, the main functions of the device 10 are activated periodically.

The device available with the trade designation L9963 with companies of the STMicroelectronics group may be exemplary of a conventional arrangement for such a device 10.

In one or more embodiments a device 10 as exemplified herein may comprise a set of converters CV1, . . . , CV14 as well as balance circuit blocks B1, . . . , B14 associated to respective cells C in the battery pack BP.

For instance, the circuit blocks B1, . . . , B14 can provide (passive) cell balancing via internal discharge paths. This action aims at balancing cells in order to facilitate an equalized charge distribution over all the cells. This is found to improve performance of the battery pack BP.

A device 10 as exemplified herein can be configured to perform automatic "validation" of failure events involving the individual cells C, or the whole battery pack BP.

The related tests can be performed automatically, for instance in the case of a failure involving either a cell C or the battery pack BP. This facilitates providing reliable information (for instance via the communication interface, CI) to an external microcontroller supervising operation of the battery management system BMS.

Automatic "validation" of such failure events may take place in various ways, for instance as discussed in Italian patent applications 102018000005810, 102018000005828 and 102019000009234 already cited.

In fact, embodiments as exemplified herein are primarily directed to acts which may be performed as a result of a failure or error event detected rather than to techniques for detecting such failures or errors.

A device 10 as exemplified herein may thus comprise at least some of the features of a BIST circuit as disclosed in Italian patent applications 102018000005810, 102018000005828, and 102019000009234 already repeatedly cited.

The representation provided in FIG. 1 is a general functional description of the device 10.

More in detail, a device 10 as exemplified herein (see, for instance, FIG. 2) may comprise charge-sensing pins Cn, namely C0, C1, . . . , C14, in the case exemplified herein. The charge-sensing pins Cn are coupled to the cells C in the battery pack BP, with, for instance, an n-th cell, Celln, arranged between the pins Cn and Cn−1.

As exemplified herein (see again, for instance, FIG. 2) a first cell Cell1 is shown arranged between the pins C0 and C1 and so on up to the cell Cell14 arranged between the pins C13 and C14.

Figure 2:
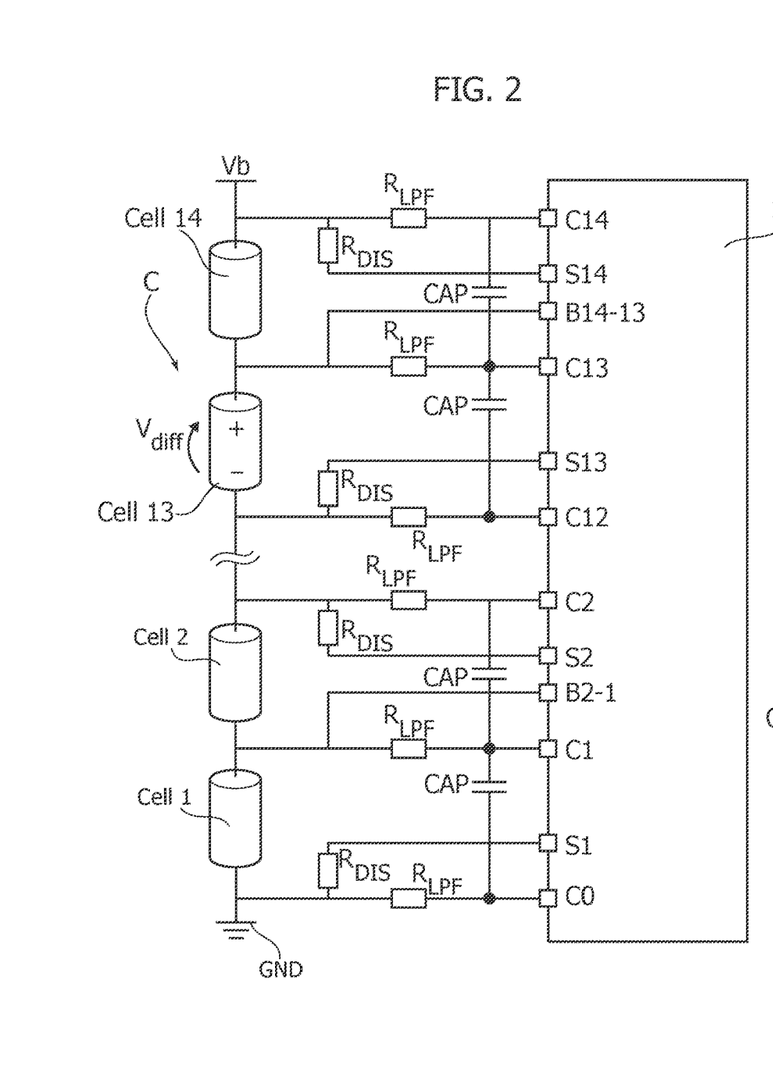
FIG. 2 is a block diagram exemplary of a device to which embodiments may apply.

For the sake of simplicity, the various cells can be considered as identical. Each of them may thus have a resistor $R_{LPF}$, arranged coupling the pins C0, . . . , C14, to respective ends of the cells Cell1, . . . , Cell14 and a capacitor CAP between adjacent pins.

The resistors $R_{LPF}$ and the capacitors CAP provide respective low-pass RC filters, which facilitate filtering out unwanted signals at the battery terminals.

In one or more embodiments the pins C0, . . . , C14 of the device 10 can be regarded as high-impedance nodes so that no appreciable voltage drop may be assumed to occur across the resistors $R_{LPF}$.

Consequently, a (differential) voltage $V_{diff}$ substantially corresponding to the voltage across the n-th cell Celln may be assumed to be available for "reading" between adjacent pins Cn−1 and Cn.

In one or more embodiments, further pins designated Sn (n=1, . . . , 14) as well as pins Bn_n−1 (with N=2, . . . , 14 in the case exemplified herein) may be used for balance purposes, namely for discharging cells which are detected to be "too charged" in order to equalize the distribution of charge over all the cells.

The amount of the (balance) discharge current may be set by resistors $R_{DIS}$ coupling the "even numbered" S pins, namely S2, . . . , S14 to the "upper" end (namely the end or node towards the overall voltage Vb of the battery pack), and the "odd numbered" S pins, namely S1, . . . , S13 to the "lower" end or node (opposite the battery pack voltage VB, that is towards ground GND) of the corresponding cell.

The pins Bn_n−1 are (directly) coupled between the resistors $R_{LPF}$ and the corresponding ends of the cells Cell1, . . . , Cell14 where no discharge resistor $R_{DIS}$ are provided.

Figure 3:
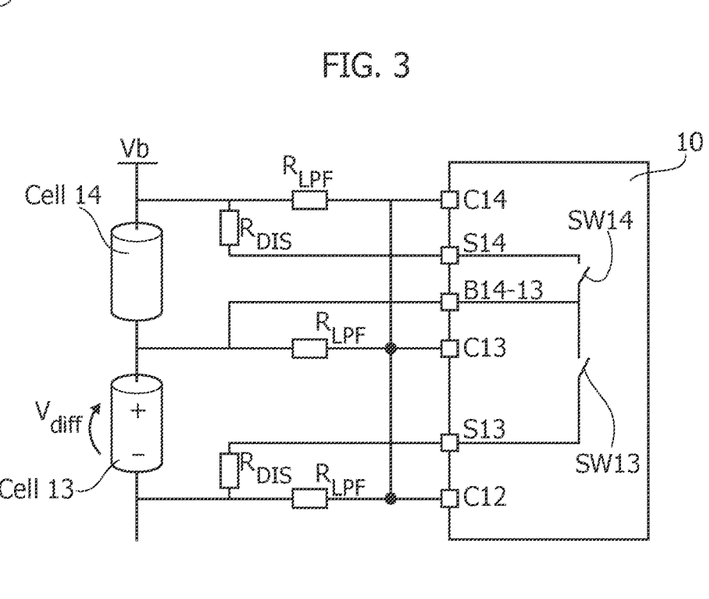
FIG. 3 is a circuit diagram exemplary of a portion of the device of FIG. 2.

FIG. 3 details by way of simplicity the arrangement discussed in the foregoing with reference to the two "uppermost" cells in the battery pack BP exemplified herein, namely Cell14 and a Cell13 by showing the corresponding coupling of the pins C12, C13, C14, S13, S14, and B14-13 of the device 10. The associated capacitors CAP shown in FIG. 2 are not reproduced in FIG. 3 for simplicity.

The device 10 as exemplified herein may thus be considered to comprise a plurality of charge-sensing pins C0 to C14 which can be regarded as arranged in an ordered (numbered) sequence of pins C0 to C14, for instance starting from ground GND to the "upper" voltage Vb node or bar of the battery pack BP, with these charge-sensing pins comprising even-numbered pins (C0, C2, C4, . . . , C14) interleaved with odd-numbered pins (C1, C3, . . . , C13).

Also, the pins C0 to C14 can be seen as comprising a plurality of pairs of charge-sensing pins, namely C0, C1; C1, C2; . . . ; C12, C13; C13, C14 arranged in an ordered sequence of:

those pairs of charge-sensing pins that are in odd-numbered positions (1, 3, 5, 7, 9, 11, 13) in the ordered sequence (from ground GND to Vb) of charge-sensing pins C1 to C14 exemplified herein, namely:
C0, C1;
C2, C3;
C4, C5;
C6, C7;
C8, C9;
C10, C11;
C12, C13; and those pairs of charge-sensing pins that are in even-numbered positions (2, 4, 6, 8, 10, 12, 14) in the ordered sequence (from ground GND to Vb) of charge-sensing pins C1 to C14 exemplified herein, namely:
C1, C2;
C3, C4;
C5, C6;
C7, C8;
C9, C10;
C11, C12;
C13, C14.

The charge sensing pins in the pairs of charge-sensing pins in the plurality of pairs (C0, C1; C1, C2; . . . ; C12, C13; C13, C14) of charge-sensing pins are coupled via a coupling resistor ($R_{LPF}$) to a respective cell (Cell1, Cell2, . . . , Cell13, Cell14) in the battery pack BP to sense the voltage across the respective cell.

Also, each odd-numbered (C0, C1; . . . ; C12, C13) resp. even-numbered (C1, C2; . . . ; C13, C14) pair of charge-sensing pins shares a common charge sensing pin (C1, . . . , C13) with the subsequent even-numbered pair (C1, C2; . . . ; C13, C14) resp. previous odd-numbered pair (C0, C1; . . . ; C12, C13) of charge-sensing pins in the ordered sequence of odd- and even-numbered pairs of charge-sensing pins.

For instance, as seen in FIG. 3:
the odd-numbered pair C12, C13 of charge-sensing pins shares a common charge sensing pin, namely C13, with the subsequent even-numbered pair C13, C14 in the ordered sequence of charge sensing pins, and, likewise
the even-numbered pair C13, C14 of charge-sensing pins shares a common charge sensing pin, again C13, with the previous odd-numbered pair C12, C13 in the ordered sequence of charge sensing pins.

Also, the charge distribution pins as exemplified herein can be regarded as comprising first charge distribution pins S1, . . . , S14 and second charge distribution pins B2-1, . . . , B14-13.

By again referring to FIG. 3, one may further note that, in a device 10 as exemplified herein, each odd-numbered pair of charge-sensing pins (C12, C13, in the case of FIG. 3) and the subsequent even-numbered pair (C13, C14, in the case of FIG. 3) of charge-sensing pins in the ordered sequence of odd- and even-numbered pairs of charge-sensing pins comprise:

a) an odd-numbered first charge distribution pin (S13, in the case of FIG. 3) coupled via a discharge resistor $R_{DIS}$ to the charge sensing pin (C12, in the case of FIG. 3) of the odd-numbered pair (C12, C13, in the case of FIG. 3) of charge-sensing pins other than the common charge sensing pin (C13, in the case of FIG. 3), b) an even-numbered first charge distribution pin (S14, in the case of FIG. 3) coupled via a discharge resistor $R_{DIS}$ to the charge sensing pin (C14, in the case of FIG. 3) of the even-numbered pair (C13, C14, in the case of FIG. 3) of charge-sensing pins other than the common charge sensing pin (C13, in the case of FIG. 3), c) a second charge distribution pin (B14-13, in the case of FIG. 3) coupled via a charge sensing resistor $R_{LPF}$ to the common charge sensing pin (C13, in the case of FIG. 3), the second charge distribution pin (here B14-

13) configured to be selectively coupled via switches SW13, SW14 to the odd-numbered first charge distribution pin (S13, in the case of FIG. 3) and the even-numbered first charge distribution pin (S14, in the case of FIG. 3) to exchange electrical charge therewith in order to perform a charge balance function.

As represented for the sake of simplicity (only) in FIG. 3, when the balance function is activated on a specific cell, associated switch circuitry is activated to discharge the cell with a current whose intensity I is given by the ratio $V_{Diff}/R_{DIS}$. Two such switches (SW13 or SW14 in FIG. 3, which may be implemented as electronic switches such as a MOSFET transistor) are shown in FIG. 3 as associated with the cells Cell13 and Cell14. A similar arrangement (not visible in the figures for simplicity) may apply to the other cells in the battery pack BP.

As discussed previously, $R_{LPF}$ and CAP define the pole (that is, the cut-off or corner frequency) of the low-pass charge-sensing filter, while the resistance value of the resistors $R_{DIS}$ defines the discharge cell current for balance purposes.

It will be appreciated that, while exemplified herein with reference to FIG. 3, where only the two cells Cell13 and Cell14 are visible, the arrangement discussed in the foregoing can be reproduced for all of the odd-numbered and even-numbered charge pin pairs in the device 10.

As noted, the ability of providing (secondary) UV/OV detection possibly along with the ability of providing an accurate measurement of cell voltages (without impairment in term of accuracy) in the presence of a fault/error is a highly desirable feature, for instance in the automotive sector.

For that purpose, one or more embodiments may take advantage of the presence of charge sensing/distribution pins and the associated circuitry (ADCs, for instance) already provided for charge sensing/balance and fault/error detection in arrangement as discussed in the foregoing.

Detection of UV/OV conditions together with cell voltage measurement without impairment in term of accuracy can thus be facilitated in one or more embodiments by saving semiconductor area with adequate performance maintained.

In one or more embodiments, this type of operation can be implemented (for instance via software code loaded in the logic circuitry L) "swapping" cells and associated ADCs in such a way that cell voltages can (still) be acquired by adjacent signal sensing circuits (primarily ADCs) with moderate efforts in terms of logic circuitry and with virtually no penalty in terms of semiconductor area.

Figure 4:
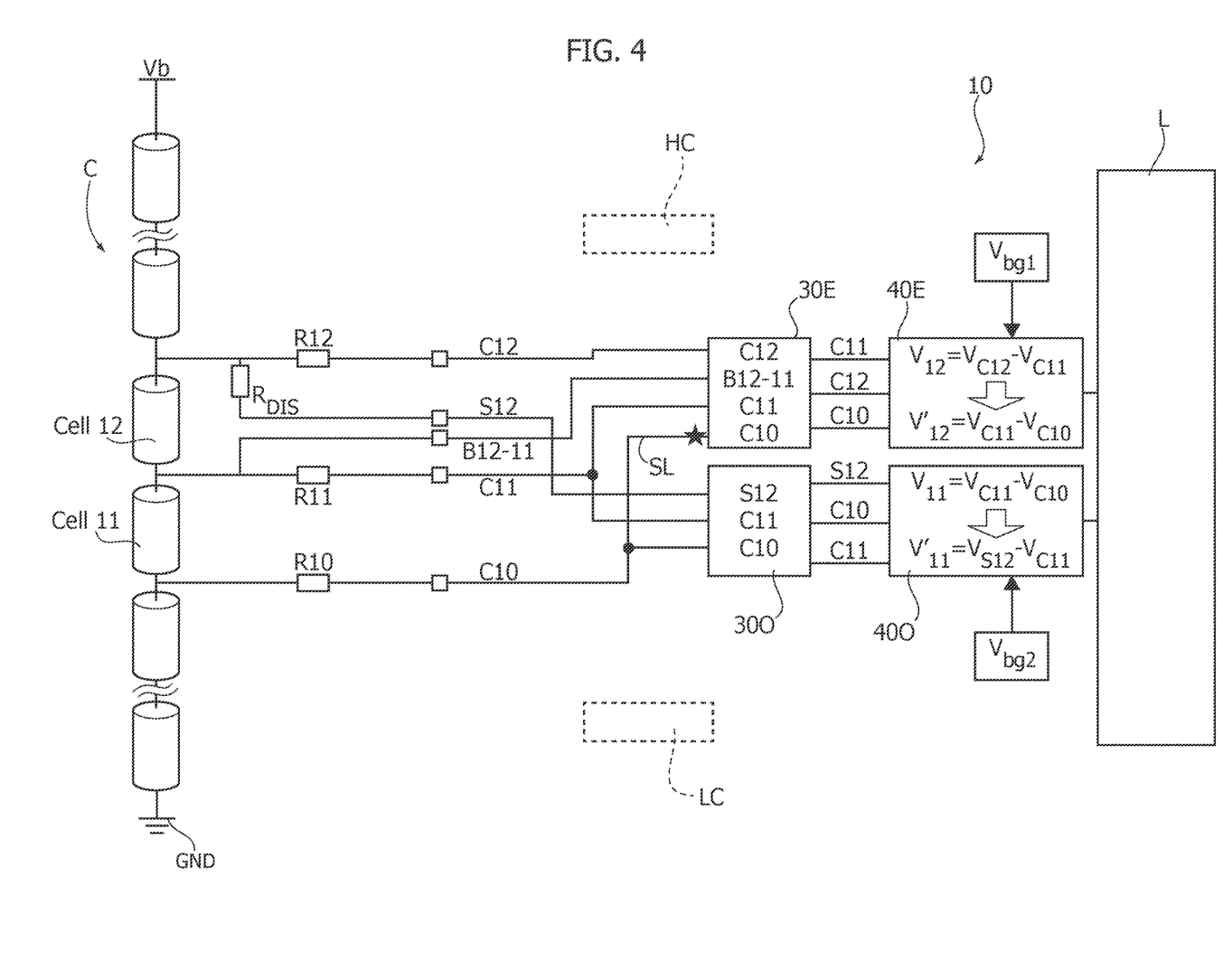
FIG. 4 is a diagram exemplary of a possible structure of embodiments.

For instance, this may involve exploiting switching, multiplexer and ADC circuitry as exemplified in FIG. 4, which may be compatible with an open load and cell measurement arrangement as disclosed in Italian patent application 102018000005828, already repeatedly cited.

A secondary UV/OV procedure can thus be run—on demand, for instance—when a fault (failure) or error is detected to occur, in an ADC, for instance) via any known technique (a built-is self-test or BIST, for instance). As a result of a corresponding conversion being held to be no longer valid (due to the fault, failure or error—as noted, these designations are used herein essentially as synonyms), that conversion is no longer taken into account and a swap function of cells is enabled, with a corresponding alternative UV/OV diagnostics (and cell voltage measurement) feature made available.

For the sake of simplicity, FIG. 4 refers to only two cells of the plurality of cells C, namely Cell11 (coupled between the odd-numbered pair of pins C10 and C11), and Cell12 (coupled between the even-numbered pair of pins C11 and C12).

It will be otherwise understood that these two cells may be regarded as lying between a set of "lower" cells LC, namely Cell1 to Cell10 and a set of "higher" cells HC, namely Cell13 and Cell14.

As exemplified in FIG. 4 the "odd-numbered" cells (Cell11 being exemplary of these) are shown coupled with a cascaded arrangement of a multiplexer 30O (30—Odd) and an analog-to-digital converter (ADC) 40O (40—Odd).

Similarly, the "even-numbered" cells (Cell12 being exemplary of these) are shown coupled with a cascaded arrangement of a multiplexer 30E (30—Even) and an analog-to-digital converter (ADC) 40E (40—Even).

In one or more embodiments as exemplified in FIG. 4 the converters 40E and 40O are supplied by respective reference voltages (bandgaps) $V_{bg1}$, $V_{bg2}$ produced—in a manner known to those of skill in the art—to be (completely) independent from each other. Undesired variations in such bandgap voltages (suited to be detected in a manner known to those of skill in the art or with the solution described in the co-pending application of even date repeatedly cited in the foregoing) may be regarded, among other events, as such possible fault or error.

For the sake of simplicity, only the multiplexer 30O, 30E and the analog-to-digital converter (ADC) 40O, 40E of the associated processing chains are visible in FIG. 4: other circuits such as a voltage level shifter block and a digital filter can be considered as incorporated to other blocks in FIG. 4. Just to make an example, a level shifter can be regarded as embedded in an analog front end of the ADC.

It will be otherwise appreciated that—while illustrated as individual, distinct elements for the sake of simplicity and ease of understanding—the various components 30O, 40O, and 30E, 40E may incorporated to single combined components.

In one or more embodiments, the multiplexers 30O, 30E may comprise each three input lines and two output lines, supplemented, in the case of the multiplexer 30E by a further (fourth) input line (labeled SL=swap line) configured to be exploited in implementing a "cell swapping" act as discussed in the following.

In one or more embodiments, the multiplexers 30O, 30E can be configured to apply to the inputs of the corresponding ADCs 40O, 40E the (voltage) signals sensed across the respective cell.

For instance, the multiplexer 30O may be configured to have applied to its input pins C10, C11 the voltage sensed across the Cell11 (via resistors R10, R11, exemplary of corresponding resistors $R_{LPF}$—again, the associated capacitors CAP are not visible for simplicity), while the multiplexer 30E may be configured to have applied to its input pins C11, C12 the voltage sensed across the Cell12 (via resistors R11, R12 exemplary of corresponding resistors $R_{LPF}$—once more, the associated capacitors CAP are not visible for simplicity).

As exemplified in FIG. 4, in one or more embodiments, the multiplexers 30O (odd-numbered cells) and 30E (even-numbered cells) may be coupled in such a way that, in each pair of an odd-numbered cell (here Cell11) and an even-numbered cell (here Cell12), the "odd-numbered" multiplexer 30O is also coupled to the "S" pin of the even-numbered cell (here, pin S12) while the "even-numbered" multiplexer 30E is also coupled to the Bn_n−1 pin (here B12_11) coupled between the two cells in the pair (here Cell11 and Cell12).

As exemplified in FIG. 4, in one or more embodiments, the multiplexers 30E (even-numbered cells) may also have its fourth input adapted to be coupled (via the swap line SL and the resistor R10, for instance) to the pin C10, namely the voltage sensing pin in the odd-numbered cell (here Cell11) other than the pin (namely C11) which is common to the odd-numbered cell (here Cell11) and the even-numbered cell (here Cell12).

Figure 7:
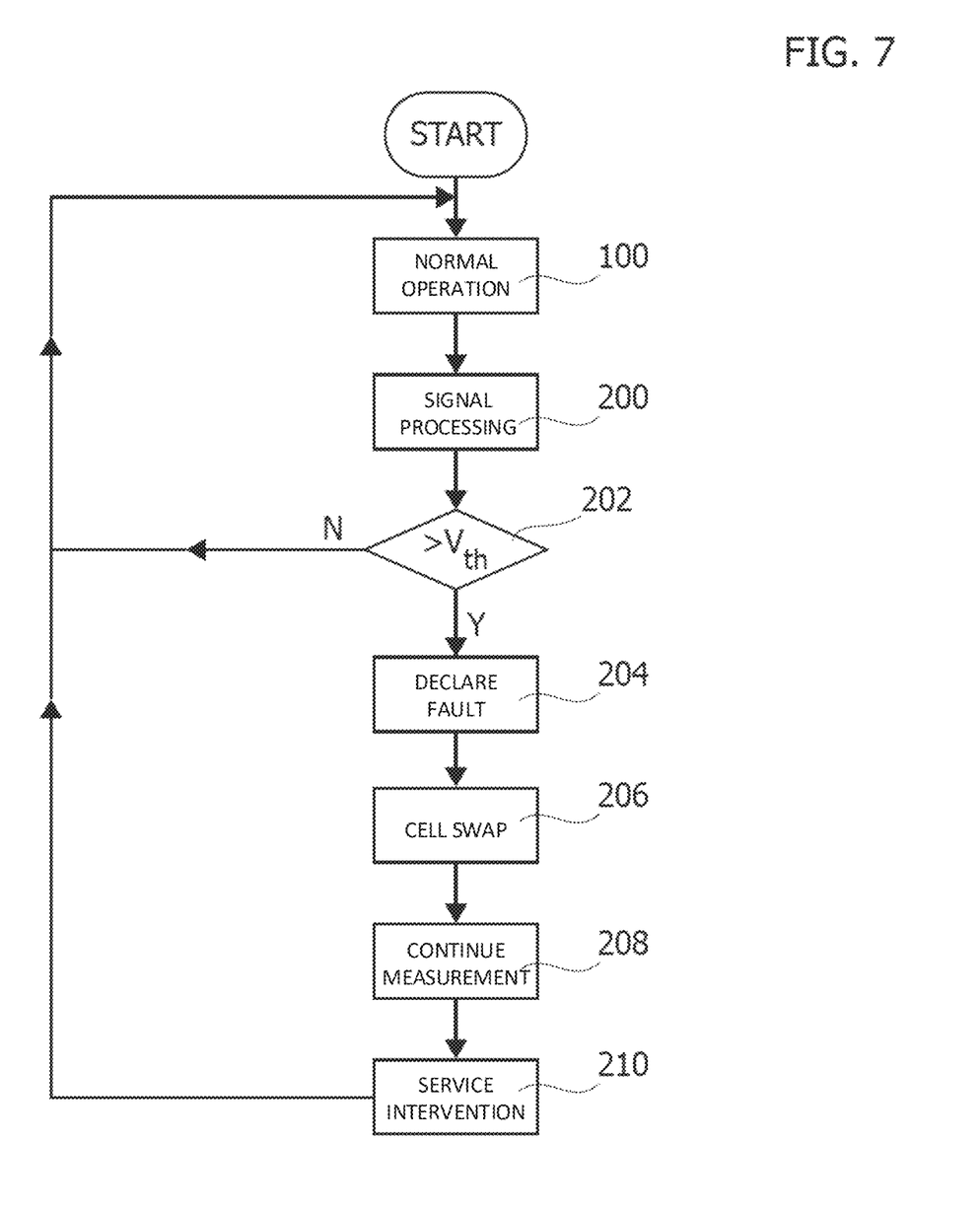
FIG. 7 is a flow chart exemplary of possible operation in embodiments.

The flowchart of FIG. 7 is exemplary of possible operation of an arrangement as exemplified herein.

Block 100 after START in the flowchart of FIG. 7 is exemplary of "normal" operation of the system (that is in the absence of faults detected) wherein the multiplexers 30E, 30O are controlled by the logic circuit L in such a way that:
  the (voltage) signals at pins C12 and C11, namely $V_{C12}$ and $V_{C11}$ are applied to the even-numbered ADC 40E;
  the (voltage) signals at pins C11 and C10, namely $V_{C11}$ and $V_{C10}$, are applied to the odd-numbered ADC 40O.

Conversion, performed in manner known per se in the converters 40E, 40O (for instance sigma-delta ADC converters), will result in a first differential signal $V_{12}=V_{C12}-V_{C11}$ (that is the difference of the signals at C12 and C11) and a second differential signal $V_{11}=V_{C11}-V_{C10}$ (that is, the difference of the signals at C11 and C10) applied to the logic circuit L (in any known manner).

One or more embodiments may involve recognizing that, with the system operating correctly (no open load or leakage, for instance), with voltage drops across R12 and $R_{DIS}$ negligible, the voltages at C12 and S12 will be expectedly equal (that is with $V_{C2}-V_{C1}=V_{S12}-V_{C1}$).

Block 200 in FIG. 7 is exemplary of various signal processing which may be performed with the capability of checking, as exemplified at 202, whether a certain signal processing chain intended to convert a voltage signal across one of the cells (as exemplified by 30O, 40O and 30E, 40E in FIG. 4) is operating adequately or is affected by a fault.

Such processing/check may involve any of a plurality of procedures (including Built-In Self-Test or BIST procedures) known to those of skill in the art for that purpose.

Such processing/check may involve a multi-step procedure involving a first "accurate" BIST act suited to detect more or less serious faults at a cell level, possibly followed, in the case a serious fault is detected, by a "rougher" test capable of identifying the part or element (an analog-to-digital converter or ADC, for instance) responsible for the fault.

For instance, the Italian patent application 102019000009234 exemplifies signal processing (in the logic circuit L—for instance) which involves calculating the absolute value (abs) of the difference between $V_{C2}-V_{C1}$ and $V_{S2}-V_{C11}$—with that absolute value (modulus) compared with a given threshold, with the capability of detecting and distinguishing accurately more or less serious faults at cell level.

Also, Italian patent applications 102018000005810 (already repeatedly cited) discloses a BIST procedure for a differential ADC capable of identifying a faulty ADC as a result of a fault detected at a cell level.

For the sake of the explanation herein, one may assume that, irrespective of the specific implementation of the acts exemplified by blocks 200 and 202:
  a negative outcome (N) of the act of block 202 (exemplified as a certain "faultiness" threshold Vth not exceeded) will result in normal operation being continued;
  a positive outcome (Y) of the act of block 202 (exemplified as a certain "faultiness" threshold Vth exceeded) will result in a faulty condition being declared in an act 204 for one of the signal processing chains (one of the ADCs 40O or 40E, for instance) associated with the cell pair comprising Cell11 and Cell12.

As exemplified herein, the faulty condition declared in the act 204 (whatever this may be and however detected) may result in the conversion (originally) provided—for either one of the cells Cell11 or Cell12, for instance for the Cell12 via the multiplexer 30E and the ADC 40E—being disregarded (that is not being taken into account, by being possibly declared "not available").

In one or more embodiments, this will lead to a "cell swap" act 206 wherein the multiplexers 30E, 30O are controlled (by the logic circuit L) in such a way that:
  the (voltage) signals at pins C11 and C10, which are both available at the input of the multiplexer 30E (via the swap line SL, in the case of the voltage at C10) are applied to the even-numbered ADC 40E with the ADC 40E configured to provide (in the place of the signal $V_{12}=V_{C12}-V_{C11}$ expected to be provided by 40E in normal operating conditions and indicative of the voltage drop across the cell Cell12) a "swapped" signal $V_{12}'=V_{C11}-V_{C10}$ (see the downward pointing arrow shown in the block 40E) indicative of the voltage drop across the cell Cell11,
  the (voltage) signals at pins S12 and C11, which are both available at the input of the multiplexer 30O are applied to the odd-numbered ADC 40O with the ADC 40O configured to provide (in the place of the signal $V_{11}=V_{C11}-V_{C10}$ expected to be provided by 40O in normal operating conditions and indicative of the voltage drop across the cell Cell11) a "swapped" signal $V_{11}'=V_{S12}-V_{C11}$ (see the downward pointing arrow shown in the block 40O) indicative of the voltage drop across the cell Cell12.

In that way, assuming, for instance, that the ADC 40E is faulty, so that the signal $V_{12}=V_{C12}-V_{C11}$ originally provided thereby is unreliable ("not available"), as a result of swapping, the corresponding measurement can be reliably provided, with a desired accuracy, as $V_{11}'=V_{S12}-V_{C11}$ by the ADC 40O by taking advantage of the fact that, as discussed previously, $V_{S12}=V_{C12}$.

Conversely, assuming that the ADC 40O is faulty, so that the signal $V_{11}=V_{Cn}-V_{C10}$ originally provided thereby is unreliable ("not available"), as a result of swapping, the corresponding measurement can be reliably provided, with a desired accuracy, as $V_{12}'=V_{C1}-V_{C10}$ by the ADC 40E.

The block 208 is exemplary of the possibility for operation of the system being continued with cell swapping so that precise signal conversion is maintained for the cells with UV/OV information continued to be derived therefrom (in a manner known per se to those of skill in the art) in compliance with safety specifications.

This is advantageous in automotive applications, for instance, insofar as vehicle operation (travel capability, for instance) can be adequately maintained at the tolerable cost of computational time increased until a service intervention is performed (block 210 in FIG. 7) with normal operation restored.

In one or more embodiments, a swapping action as discussed previously can take place under the control of the logic circuit L (a microcontroller, for instance).

For instance, acts as exemplified in blocks 204 to 210 may involve, as a result of a fault being detected (via a BIST as discussed previously, for instance):
  deleting the conversion and the diagnosis error related to a faulty processing chain (ADC, for instance), saving the information about the cells and merged in a step (possibly enabled via SPI) wherein a swap function is activated as discussed previously, once the swap function is enabled, the information is deleted except for the cell under analysis, with fault eventually read and cleared and routine operation started again.

Figure 5:
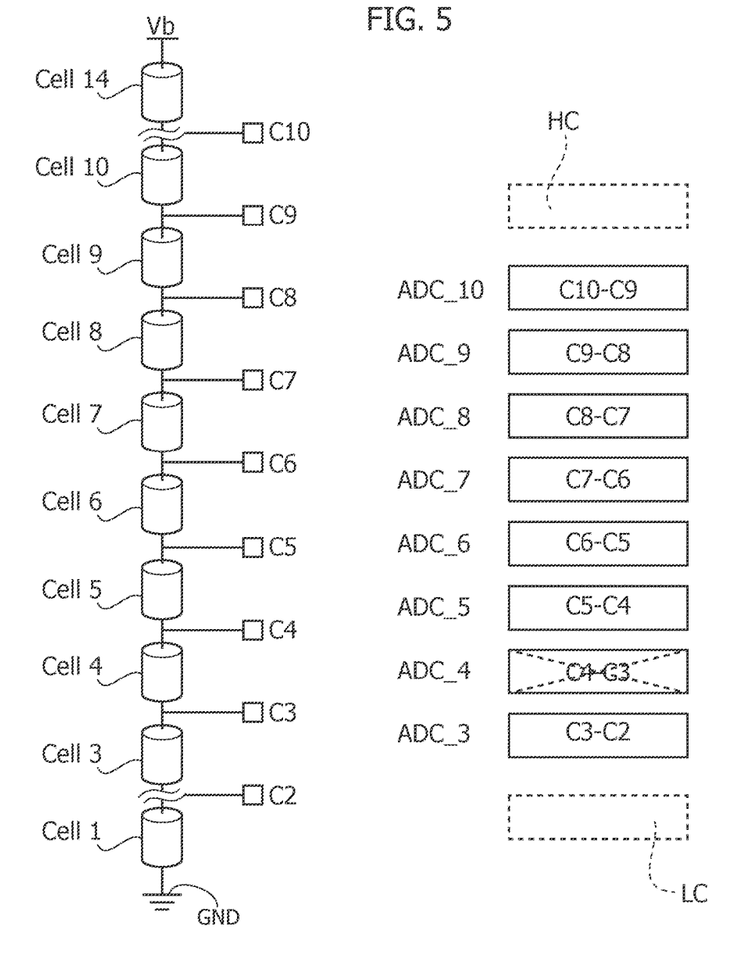
FIGS. 5 and 6 are diagrams exemplary of operation of embodiments.
Figure 6:
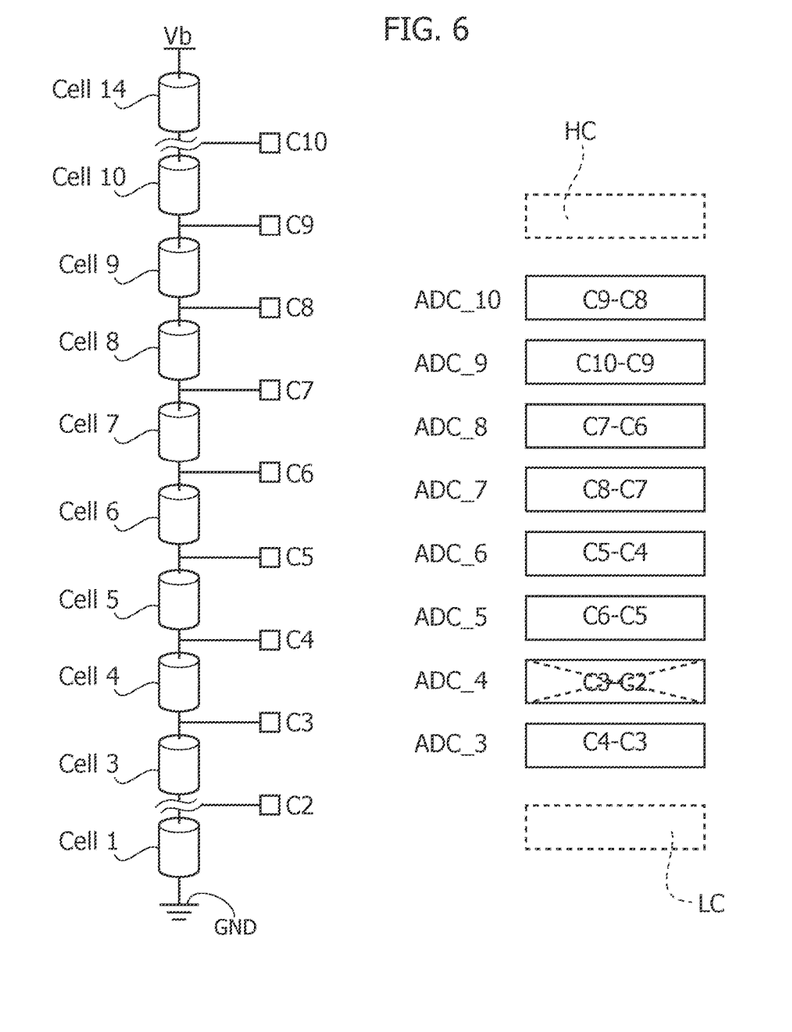

FIGS. 5 and 6 (where cells such as Cell2 and Cell11, Cell12 and Cell13 are not visible for compactness) are further exemplary of the cell swapping procedure discussed in the foregoing.

For instance, FIG. 5 is exemplary of case where an error (damaged ADC, for instance) is detected affecting the sensing action between the pins C3 and C4 (even numbered cell, Cell4, ADC_4).

As a result (voltage) signal conversion will be not be available for C4-C3 while available both for "lower" pins (C3-C2, for instance) and "higher" pins (C5-C4, C6-C5, C7-C6, C8-C7, ...)

Since an error occurring on (for instance) ADC_4 has been detected, conversion on ADC_4, that is C4-C3, is not taken into account and the swap function is enabled.

FIG. 6 exemplifies that, as a result of the swapping action discussed herein, the voltage drop $V_{diff}$ across C4-C3 is measured on an adjacent (odd numbered) cell such as Cell3, using the respective ADC, namely ADC_3, thus facilitating UV/OV detection (and voltage measurement) on the associated cell.

Stated otherwise, as a result of a self-test (however performed: see, for instance, the earlier/co-pending applications already repeatedly cited) revealing a faulty condition a swapping procedure of the cells is performed as discussed previously.

For instance, as already discussed in connection with FIG. 4 (where only the cells Cell11 and Cell12 are exemplified in detail for simplicity):

under normal operating conditions, the ADC 40E measures $V_{12}=V_{C12}-V_{C11}$ corresponding to cell Cell12 while the ADC 40O measures $V_{11}=V_{C11}-V_{C10}$ corresponding to cell Cell11;

as a result of a self-test revealing a faulty condition in either one of 40E or 40O, in order to continue measuring UV/OV as desired, cell swapping is effected so that the ADC 40E will be configured to measure $V'_{12}=V_{C11}-V_{C10}$ corresponding to cell Cell11 while the ADC 40O will be configured to measure $V'_{11}=V_{S12}-V_{C11}$ corresponding to cell Cell12.

In that way, the measurement no longer available from a faulty ADC (40E, respectively 40O) will be provided—with no loss in accuracy—via a neighboring ADC (40O, respectively 40E).

As illustrated in FIGS. 5 and 6, such a procedure exemplified in FIG. 4 for the pair of cells Cell 11 and Cell12 may be applied to other pairs of neighboring cells in the system.

FIG. 5 is exemplary of a condition where, during normal cell measurement, one conversion channel (for instance ADC_4 active between C4 and C3) is found to be faulty, via a BIST procedure, for instance. As a result, the measurement from this conversion channel (ADC, for instance) is considered not reliable (and declared "not available", for instance).

Cell swapping is thus activated as exemplified in FIG. 6 where the cell for which "normal" measurement has been declared not available is measured via an adjacent conversion channel (for instance ADC_3, again active between C4 and C3).

In that way, the arrangement exemplified herein may continue to provide measurements for all the cells, with only an increased (doubled) time of execution.

This may be due, for instance, to the fact that, during operation as exemplified in FIG. 5, measurements for the cell are saved for cells Cell1 to Cell14, except for Cell4 (where ADC_4 was found to be faulty).

As a result of cell swapping as exemplified in FIG. 6, the measurement for cell Cell4 (as provided via ADC_3) is saved, so that information for all the cells Cell1 to Cell14 (including Cell4) becomes eventually available (with a desired accuracy, unaffected by the fault condition).

In one or more embodiments, the two conditions exemplified in FIG. 5 and FIG. 6 can be continued to be alternated, thus providing continued measurements for all the cells Cell1 to Cell14.

In one or more embodiments, a BIST procedure can be performed for any cell Cell1 to Cell14, virtually at anytime (cyclically or on demand). If the procedure reveals a failure, standard measurement and "swapping" measurement.

For instance, for any pair of an odd-numbered cell and a subsequent even-numbered cell (for instance Cell11 and Cell12 in FIG. 4, respectively):

a) during the standard measurement:
the even-numbered ADC 40E (ADC_12) is configured to measure $V_{12}=V_{C12}-V_{C11}$, that is the voltage across the even-numbered cell Cell12, and
the odd-numbered ADC 40O (ADC_11) is configured to measure $V_{11}=V_{C11}-V_{C10}$, that is the voltage across the odd-numbered cell Cell11, b) during the "swapping" measurement:
the even-numbered ADC 40E (ADC_12) is configured to measure $V'_{12}=V_{C11}-V_{C10}$, that is the voltage across the odd-numbered cell Cell11, and
the odd-numbered ADC 40O (ADC_11) is configured to measure $V'_{11}=V_{S12}-V_{C11}$, that is the voltage across the even-numbered cell Cell12.

One or more embodiments may thus rely on internal charge transfer paths (already) provided for balancing the cells in a battery pack in order to facilitate charge equalization between the cells.

One or more embodiments may be compatible with a built-in self-test (BIST) feature the verifies the adequate functionality of the $V_{diff}$ sensing chains (internal analog comparators and ADCs, for instance) with a check procedure which can be automatically performed in case of a failure of either one of two cells or a battery pack as a whole, with the capability of providing corresponding (reliable) information—to an external microcontroller, for instance.

A method as exemplified herein may facilitate operating a control device (for instance, 10) in a battery management system (for instance, BMS), wherein:

the control device comprises an ordered sequence of charge-sensing pins (for instance, C0 to C14) arranged in a plurality of pairs (for instance, C0, C1; C1, C2; ...; C12, C13; C13, C14) of charge-sensing pins in an ordered sequence of odd- and even-numbered pairs of charge-sensing pins, the charge sensing pins in each pair of charge-sensing pins in the plurality of pairs (for instance, C0, C1; C1, C2; ...; C12, C13; C13, C14) of charge-sensing pins coupled ($R_{LPF}$) to a respective cell (for instance, Cell1, Cell2, ..., Cell13, Cell14) in a battery pack to sense the voltage across the respective cell, wherein each odd-numbered (for instance, C0, C1; ...; C12, C13) resp. even-numbered (for instance, C1, C2; ...; C13, C14) pair of charge-sensing pins shares a common charge sensing pin (for instance, C1, . . . , C13) with a subsequent even-numbered pair (for instance, C1, C2; . . . ; C13, C14) resp. a previous odd-numbered pair (for instance, C0, C1; . . . ; C12, C13) of charge-sensing pins in the ordered sequence of odd- and even-numbered pairs of charge-sensing pins, each odd-numbered pair (for instance, C0, C1; . . . ; C12, C13) of charge-sensing pins and the subsequent even-numbered pair (for instance, C1, C2; . . . ; C13, C14) of charge-sensing pins in the ordered sequence of odd- and even-numbered pairs of charge-sensing pins comprise a charge distribution pin (for instance, S2, S4, . . . , S12, . . . , S14) coupled (for instance, $R_{DIS}$) to the charge sensing pin of the even-numbered pair of charge-sensing pins other than the common charge sensing pin (for instance, C1, . . . , C13).

A method as exemplified herein may comprise, for an odd-numbered pair (see, for instance C10, C11 in FIG. 4) of charge-sensing pins and the subsequent even-numbered pair (see, for instance C11, C12 in FIG. 4) of charge-sensing pins in the ordered sequence of odd- and even-numbered pairs of charge-sensing pins:

a) sensing (see, for instance 100, 30E, 40E, 30O, 40O):
   a first voltage drop (for instance, $V_{12}$) between the charge sensing pin (for instance, C12) of the subsequent even-numbered pair other than the common charge sensing pin and the common charge sensing pin (for instance, C11), the first voltage drop being indicative of the voltage drop across the charge sensing pins of the subsequent even-numbered pair, and
   a second voltage drop (for instance, $V_{11}$) between the common charge sensing pin (for instance, C11) and the charge sensing pin (for instance, C10) of the previous odd-numbered pair other than the common charge sensing pin, the second voltage drop being indicative of the voltage drop across the charge sensing pins of the previous odd-numbered pair, b) as a result of a faulty condition detected (for instance, 202) in the device:
   swapping for the first voltage drop a first swapped voltage drop (for instance, $V_{12}'$) between the common charge sensing pin (for instance, C11) and the charge sensing pin (for instance, C10) of the previous odd-numbered pair other than the common charge sensing pin, wherein the first swapped voltage drop is indicative of the voltage drop across the charge sensing pins of the previous odd-numbered pair,
   swapping for the second voltage drop a second swapped voltage drop (for instance, $V_{11}'$) between the charge distribution pin (for instance, S12) coupled (for instance, via $R_{DIS}$) to the charge sensing pin (for instance, C12) of the subsequent even-numbered pair other than the common charge sensing pin and the common charge sensing pin (for instance, C11), wherein the second swapped voltage drop is indicative of the voltage drop across the charge sensing pins of the subsequent even-numbered pair (for instance, C11, C12).

A method as exemplified herein may comprise, as a result of a faulty condition detected for either one (for instance, for either one of the ADCs 40O, 40E in FIG. 4) of the subsequent even-numbered pair (for instance, C11, C12 in FIG. 4) and previous odd-numbered pair (for instance, C10, C11 in FIG. 4) of charge-sensing pins:

discarding the first voltage drop (for instance, $V_{12}$) resp. second voltage drop (for instance, $V_{11}$) for the pair of charge-sensing pins for which the faulty condition is detected (see also C4-C3 discarded in FIG. 5 due to ADC_4 found to be faulty), and replacing the first resp. second voltage drop discarded with the first (for instance, $V_{12}'$) resp. second (for instance, $V_{11}'$) swapped voltage drop swapped therefor (see also C4-C3 as provided by ADC_3—not faulty—in FIG. 6).

A method as exemplified herein may comprise, as a result of a faulty condition detected for a pair of charge-sensing pins in the plurality of pairs (for instance, C0, C1; C1, C2; . . . ; C12, C13; C13, C14) of charge-sensing pins in the ordered sequence of odd- and even-numbered pairs of charge-sensing pins, a first act of recording (for instance, at L) the first ($V_{12}$) and second ($V_{11}$) voltage drops for the plurality of pairs of charge-sensing pins with the exception of the first ($V_{12}$) resp. second ($V_{11}$) voltage drop for the pair of charge-sensing pins for which the faulty condition is detected (see again, for instance, C4-C3 discarded in FIG. 5 due to ADC_4 found to be faulty), and a second act of recording, for the pair of charge-sensing pins for which the faulty condition is detected, the first resp. second swapped voltage drop swapped for the first resp. second voltage drop for the pair of charge-sensing pins for which the faulty condition is detected (see again C4-C3 as provided by ADC_3—not faulty—in FIG. 6).

A method as exemplified herein may comprise alternating the second act of recording to the first act of recording, so that reliable measures can be obtained for all the pin pairs (that is, for all the cells) although with a measurement time increased (doubled).

A method as exemplified herein may comprise swapping the first resp. second swapped voltage drop for the first resp. second voltage drop between the first act of recording and the second act of recording.

A method as exemplified herein may comprise providing first (for instance, 30E, 40E) and second (for instance, 30O, 40O) signal sensing circuitry configured to sense the first voltage drop and the second voltage drop wherein the first and second signal sensing circuitry have a sensing resolution (ADC resolution, for instance), wherein the sensing resolution is maintained for the first and second swapped voltage drops (as a result of the first and second swapped voltage drops being likewise sensed via the first and second signal sensing circuitry, in a swapped configuration).

A method as exemplified may comprise applying undervoltage and/or overvoltage detection to the first resp. second swapped voltage drop.

A control device (for instance, 10) for a battery management system (for instance, BMS) as exemplified herein may comprise:

an ordered sequence of charge-sensing pins (C0 to C14) arranged in a plurality of pairs (C0, C1; C1, C2; . . . ; C12, C13; C13, C14) of charge-sensing pins in an ordered sequence of odd- and even-numbered pairs of charge-sensing pins, the charge sensing pins in each pair of charge-sensing pins in the plurality of pairs (C0, C1; C1, C2; . . . ; C12, C13; C13, C14) of charge-sensing pins configured to be coupled ($R_{LPF}$) to a respective cell (Cell1, Cell2, . . . , Cell13, Cell14) in a battery pack (BP) to sense the voltage across the respective cell, wherein each odd-numbered (for instance, C10, C11) resp. even-numbered (for instance, C11, C12) pair of charge-sensing pins shares a common charge sensing pin (for instance, C1, . . . , C13) with the subsequent even-numbered pair resp. previous odd-numbered pair of charge-sensing pins in the ordered sequence of odd- and even-numbered pairs of charge-sensing pins, wherein each odd-numbered pair of charge-sensing pins and the subsequent even-numbered pair charge-sensing pins in the ordered sequence of odd- and even-numbered pairs of charge-sensing pins comprise a charge distribution pin (for instance, S2, S4, . . . , S14) configured to be coupled (for instance, via $R_{DIS}$) to the charge sensing pin of the even-numbered pair of charge-sensing pins other than the common charge sensing pin, wherein the device may comprise a processor circuit (for instance, L) as well as signal sensing circuitry (for instance, 30E, 30O; 40E, 40A), wherein the device is configured to operate with the method as exemplified herein, and comprises:

the signal sensing circuitry configurable (for instance, via the multiplexers 30E, 30O) to sense the first and second voltage drops (for instance, $V_{12}$; $V_{11}$) as well as the first and second swapped voltage drops (for instance, $V'_{12}$; $V'_{11}$), the processor circuit (for instance, L) configured to sense a faulty condition detected in the device and to swap the first and second swapped voltage drops for the first and second voltage drops as a result of the faulty condition detected.

In a control device as exemplified herein the signal sensing circuitry may comprise, for an odd-numbered pair (for instance C10, C11) of charge-sensing pins and the subsequent even-numbered pair (C1, C2; . . . ; C13, C14) of charge-sensing pins in the ordered sequence of odd- and even-numbered pairs of charge-sensing pins:

first signal sensing circuitry (for instance, 30E, 40E) configured (for instance, via the multiplexer 30E) to be coupled:
i) to the charge sensing pin (for instance, C12) of the subsequent even-numbered pair (C11, C12) other than the common charge sensing pin and the common charge sensing pin (for instance, C11) to sense the first voltage drop (for instance, $V_{12}$) therebetween, and
ii) to the common charge sensing pin (for instance, C11) and the charge sensing pin (for instance, C10) of the previous odd-numbered pair (for instance, C10, C11) other than the common charge sensing pin, to sense the first swapped voltage drop (for instance, $V_{12}'$) therebetween, second signal sensing circuitry (for instance, 30O, 40O) configured (for instance, vie the multiplexer 30O) to be coupled:
i) to the common charge sensing pin (for instance, C11) and the charge sensing pin (for instance, C10) of the previous odd-numbered pair (for instance, C10, C11) other than the common charge sensing pin, to sense the second voltage drop (for instance, $V_{11}$) therebetween,
ii) to the charge distribution pin (for instance, S12) coupled (for instance, via $R_{DIS}$) to the charge sensing pin of the subsequent even-numbered pair (for instance, C11, C12) other than the common charge sensing pin and the common charge sensing pin (C11) to sense the second swapped voltage drop (for instance, $V'_{11}$) therebetween.

An electrically powered vehicle as exemplified herein (for instance, V) may comprise:
a battery pack (for instance, BP) comprising a plurality of electrical battery cells (for instance, C),
a battery management system (for instance, BMS) coupled to the battery pack,
a control device (for instance, 10) as exemplified herein configured to control the battery management system.

Without prejudice to the underlying principles, the details and embodiments may vary, even significantly, with respect to what has been described by way of example only without departing from the extent of protection.

The extent of protection is determined by the annexed claims.

What is claimed is:

1. A control device for battery management, the control device comprising:
a first circuit comprising a first multiplexer and a first analog-to-digital converter (ADC), the first circuit coupled to a first battery cell and a second battery cell and configured to sense a voltage drop across the first battery cell, the first circuit further configured to sense a swapped voltage drop across the second battery cell in response to detecting a faulty condition in the second battery cell; and
a second circuit comprising a second multiplexer and a second ADC, the second circuit coupled to the first battery cell and the second battery cell and configured to sense a voltage drop across the second battery cell, the second circuit further configured to sense a swapped voltage drop across the first battery cell in response to detecting a faulty condition in the first battery cell.

2. The control device of claim 1, wherein:
the first battery cell and the second battery cell both include a first terminal and a second terminal, the second terminal of the first battery cell and the first terminal of the second battery cell being connected together as a common terminal, and
the control device further comprises a charge balance circuit including a first charge distribution pin coupled to the first terminal of the first battery cell, a second charge distribution pin coupled to the common terminal, and a third charge distribution pin coupled to the second terminal of the second battery cell, the charge balance circuit configured to perform a charge balance function by discharging either the first battery cell or the second battery cell or both.

3. The control device of claim 2, wherein:
a first input of the first multiplexer is coupled to the first terminal of the first battery cell,
a second input of the first multiplexer is coupled to the second terminal of the first battery cell,
a third input of the first multiplexer is coupled to the second terminal of the second battery cell via the third charge distribution pin, and
a first output of the first multiplexer and a second output of the first multiplexer are coupled to the first ADC, the first ADC configured to sense a difference between the first output of the first multiplexer and the second output of the first multiplexer.

4. The control device of claim 3, wherein:
the first multiplexer is configured to output the first input of the first multiplexer and the second input of the first multiplexer to the first ADC in response to not detecting the faulty condition in the second battery cell, the voltage drop across the first battery cell is a voltage difference between the first terminal of the first battery cell and the second terminal of the first battery cell sensed by the first ADC in response to not detecting the faulty condition in the second battery cell, the first multiplexer is configured to output the second input of the first multiplexer and the third input of the first multiplexer to the first ADC in response to detecting the faulty condition in the second battery cell, and the swapped voltage drop across the second battery cell is a voltage difference between the first terminal of the second battery cell and the second terminal of the second battery cell sensed by the first ADC in response to detecting the faulty condition in the second battery cell.

5. The control device of claim 4, wherein the faulty condition in the second battery cell is detected by the second ADC using a built-in self-test procedure.

6. The control device of claim 2, wherein:
a first input of the second multiplexer is coupled to the first terminal of the second battery cell,
a second input of the second multiplexer is coupled to the second terminal of the second battery cell,
a third input of the second multiplexer is coupled to the first terminal of the first battery cell, and
a first output of the second multiplexer and a second output of the second multiplexer are coupled to the second ADC, the second ADC configured to sense a difference between the first output of the second multiplexer and the second output of the second multiplexer.

7. The control device of claim 6, wherein the second multiplexer further comprises a fourth input coupled to the common terminal via the second charge distribution pin.

8. The control device of claim 6, wherein:
the second multiplexer is configured to output the first input of the second multiplexer and the second input of the second multiplexer to the second ADC in response to not detecting the faulty condition in the first battery cell,
the voltage drop across the second battery cell is a voltage difference between the first terminal of the second battery cell and the second terminal of the second battery cell sensed by the second ADC in response to not detecting the faulty condition in the first battery cell,
the second multiplexer is configured to output the second input of the second multiplexer and the third input of the second multiplexer to the second ADC in response to detecting the faulty condition in the first battery cell, and
the swapped voltage drop across the first battery cell is a voltage difference between the first terminal of the first battery cell and the second terminal of the first battery cell sensed by the second ADC in response to detecting the faulty condition in the first battery cell.

9. The control device of claim 8, wherein the faulty condition in the first battery cell is detected by the first ADC using a built-in self-test procedure.

10. The control device of claim 2, wherein:
the first charge distribution pin is coupled to the second charge distribution pin via a first electronic switch, and
the second charge distribution pin is coupled to the third charge distribution pin via a second electronic switch, each of the first electronic switch and the second electronic switch being implemented using a metal-oxide-semiconductor field-effect transistor (MOSFET).

11. A control device for battery management, the control device comprising:
a plurality of circuits arranged in an ordered sequence of odd- and even-numbered circuits, each of the plurality of circuits coupled to a respective battery cell in an ordered sequence of odd- and even-numbered battery cells, wherein:
an odd-numbered circuit comprises a first multiplexer and a first analog-to-digital converter (ADC), the odd-numbered circuit coupled to an odd-numbered battery cell and a subsequent even-numbered battery cell and configured to sense a voltage drop across the odd-numbered battery cell, the odd-numbered circuit further configured to sense a swapped voltage drop across the subsequent even-numbered battery cell in response to detecting a faulty condition in the subsequent even-numbered battery cell; and
a subsequent even-numbered circuit comprises a second multiplexer and a second ADC, the subsequent even-numbered circuit coupled to the odd-numbered battery cell and the subsequent even-numbered battery cell and configured to sense a voltage drop across the subsequent even-numbered battery cell, the subsequent even-numbered circuit further configured to sense a swapped voltage drop across the odd-numbered battery cell in response to detecting a faulty condition in the odd-numbered battery cell.

12. The control device of claim 11, wherein:
the odd-numbered battery cell and the subsequent even-numbered battery cell both include a first terminal and a second terminal, the second terminal of the odd-numbered battery cell and the first terminal of the subsequent even-numbered battery cell being connected together as a common terminal, and
the control device further comprises an ordered sequence of odd- and even-numbered charge balance circuits, wherein:
an odd-numbered charge balance circuit includes a first charge distribution pin coupled to the first terminal of the odd-numbered battery cell and a second charge distribution pin coupled to the common terminal, the odd-numbered charge balance circuit configured to perform a charge balance function by discharging the odd-numbered battery cell, and
a subsequent even-numbered charge balance circuit shares the second charge distribution pin with the odd-numbered charge balance circuit and further includes a third charge distribution pin coupled to the second terminal of the subsequent even-numbered battery cell, the subsequent even-numbered charge balance circuit configured to perform a charge balance function by discharging the subsequent even-numbered battery cell.

13. The control device of claim 12, wherein:
a first input of the first multiplexer is coupled to the first terminal of the odd-numbered battery cell,
a second input of the first multiplexer is coupled to the second terminal of the odd-numbered battery cell,
a third input of the first multiplexer is coupled to the second terminal of the subsequent even-numbered battery cell via the third charge distribution pin, and
a first output of the first multiplexer and a second output of the first multiplexer are coupled to the first ADC, the first ADC configured to sense a difference between the first output of the first multiplexer and the second output of the first multiplexer.

14. The control device of claim 13, wherein:
the first multiplexer is configured to output the first input of the first multiplexer and the second input of the first multiplexer to the first ADC in response to not detecting the faulty condition in the subsequent even-numbered battery cell,
the voltage drop across the odd-numbered battery cell is a voltage difference between the first terminal of the odd-numbered battery cell and the second terminal of the odd-numbered battery cell sensed by the first ADC in response to not detecting the faulty condition in the subsequent even-numbered battery cell,
the first multiplexer is configured to output the second input of the first multiplexer and the third input of the first multiplexer to the first ADC in response to detecting the faulty condition in the subsequent even-numbered battery cell, and
the swapped voltage drop across the subsequent even-numbered battery cell is a voltage difference between the first terminal of the subsequent even-numbered battery cell and the second terminal of the subsequent even-numbered battery cell sensed by the first ADC in response to detecting the faulty condition in the subsequent even-numbered battery cell.

15. The control device of claim 14, wherein the faulty condition in the subsequent even-numbered battery cell is detected by the second ADC using a built-in self-test procedure.

16. The control device of claim 12, wherein:
a first input of the second multiplexer is coupled to the first terminal of the subsequent even-numbered battery cell,
a second input of the second multiplexer is coupled to the second terminal of the subsequent even-numbered battery cell,
a third input of the second multiplexer is coupled to the first terminal of the odd-numbered battery cell, and
a first output of the second multiplexer and a second output of the second multiplexer are coupled to the second ADC, the second ADC configured to sense a difference between the first output of the second multiplexer and the second output of the second multiplexer.

17. The control device of claim 16, wherein the second multiplexer further comprises a fourth input coupled to the common terminal via the second charge distribution pin.

18. The control device of claim 16, wherein:
the second multiplexer is configured to output the first input of the second multiplexer and the second input of the second multiplexer to the second ADC in response to not detecting the faulty condition in the odd-numbered battery cell,
the voltage drop across the subsequent even-numbered battery cell is a voltage difference between the first terminal of the subsequent even-numbered battery cell and the second terminal of the subsequent even-numbered battery cell sensed by the second ADC in response to not detecting the faulty condition in the odd-numbered battery cell,
the second multiplexer is configured to output the second input of the second multiplexer and the third input of the second multiplexer to the second ADC in response to detecting the faulty condition in the odd-numbered battery cell, and
the swapped voltage drop across the odd-numbered battery cell is a voltage difference between the first terminal of the odd-numbered battery cell and the second terminal of the odd-numbered battery cell sensed by the second ADC in response to detecting the faulty condition in the odd-numbered battery cell.

19. The control device of claim 18, wherein the faulty condition in the odd-numbered battery cell is detected by the first ADC using a built-in self-test procedure.

20. The control device of claim 12, wherein:
the first charge distribution pin is coupled to the second charge distribution pin via a first electronic switch, and
the second charge distribution pin is coupled to the third charge distribution pin via a second electronic switch, each of the first electronic switch and the second electronic switch being implemented using a metal-oxide-semiconductor field-effect transistor (MOSFET).

21. An electrically powered vehicle, comprising:
a battery pack comprising an ordered sequence of odd- and even-numbered battery cells;
a battery management system coupled to the battery pack; and
a control device configured to control the battery management system, the control device comprising:
a plurality of circuits arranged in an ordered sequence of odd- and even-numbered circuits, each of the plurality of circuits coupled to a respective battery cell in the ordered sequence of odd- and even-numbered battery cells, wherein:
an odd-numbered circuit comprises a first multiplexer and a first analog-to-digital converter (ADC), the odd-numbered circuit coupled to an odd-numbered battery cell and a subsequent even-numbered battery cell and configured to sense a voltage drop across the odd-numbered battery cell, the odd-numbered circuit further configured to sense a swapped voltage drop across the subsequent even-numbered battery cell in response to detecting a faulty condition in the subsequent even-numbered battery cell; and
a subsequent even-numbered circuit comprises a second multiplexer and a second ADC, the subsequent even-numbered circuit coupled to the odd-numbered battery cell and the subsequent even-numbered battery cell and configured to sense a voltage drop across the subsequent even-numbered battery cell, the subsequent even-numbered circuit further configured to sense a swapped voltage drop across the odd-numbered battery cell in response to detecting a faulty condition in the odd-numbered battery cell.

* * * * *